(12) United States Patent
Takiguchi et al.

(10) Patent No.: US 7,835,413 B2
(45) Date of Patent: Nov. 16, 2010

(54) SEMICONDUCTOR LASER

(75) Inventors: Tohru Takiguchi, Tokyo (JP); Yuichiro Okunuki, Tokyo (JP); Go Sakaino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 8 days.

(21) Appl. No.: 12/198,152

(22) Filed: Aug. 26, 2008

(65) Prior Publication Data

US 2009/0290611 A1    Nov. 26, 2009

(30) Foreign Application Priority Data

May 26, 2008    (JP)    ............................. 2008-136513

(51) Int. Cl.
H01S 5/00 (2006.01)
(52) U.S. Cl. ................. 372/46.01; 372/43.01
(58) Field of Classification Search ............. 372/45.01, 372/46.01
See application file for complete search history.

(56) References Cited

U.S. PATENT DOCUMENTS

| | | | |
|---|---|---|---|
| 5,214,662 A | 5/1993 | Irikawa et al. | |
| 5,218,614 A * | 6/1993 | Mihashi | 372/46.01 |
| 5,281,829 A | 1/1994 | Chinen | |
| 5,452,315 A | 9/1995 | Kimura et al. | |
| 5,692,002 A | 11/1997 | Mizutani | |
| 5,717,710 A | 2/1998 | Miyazaki et al. | |
| 5,936,990 A | 8/1999 | Nakamura | |
| 7,504,664 B2 | 3/2009 | Takiguchi | |
| 2003/0062517 A1* | 4/2003 | Ryder et al. | 257/12 |
| 2004/0213313 A1* | 10/2004 | Akulova et al. | 372/46 |
| 2005/0141578 A1* | 6/2005 | Reid et al. | 372/45 |
| 2008/0049805 A1 | 2/2008 | Takiguchi et al. | |

FOREIGN PATENT DOCUMENTS

| | | |
|---|---|---|
| JP | 05-013882 A | 1/1983 |
| JP | 05-075214 A | 3/1993 |
| JP | 07-022691 A | 1/1995 |
| JP | 08-162701 A | 6/1996 |
| JP | 08-255950 A | 10/1996 |

* cited by examiner

*Primary Examiner*—Minsun Harvey
*Assistant Examiner*—Xnning Niu
(74) *Attorney, Agent, or Firm*—Leydig, Voit & Mayer, Ltd.

(57) ABSTRACT

A semiconductor laser comprises: a ridge structure including a p-type cladding layer, an active layer, and an n-type cladding layer stacked on one another; and a burying layer burying sides of the ridge structure. The burying layer includes a p-type semiconductor layer and an n-type semiconductor layer that form a pn junction; and one of the p-type semiconductor layer and the n-type semiconductor layer has a carrier concentration of $5\times10^{17}$ cm$^{-3}$ or less near the pn junction.

2 Claims, 8 Drawing Sheets

SEMICONDUCTOR LASER

BACKGROUND OF THE INVENTION

1. Field of the Invention

The present invention relates to a buried semiconductor laser in which both sides of the ridge structure are buried under a burying layer, and also relates to a method for manufacturing such a semiconductor laser.

2. Background Art

Burying layers for buried semiconductor lasers have been proposed which include a pn junction or a semi-insulating InP layer. Further, semiconductor lasers have been disclosed whose burying layer includes a semi-insulating Al(Ga)InAs layer in addition to a semi-insulating InP layer in order to reduce the leakage current of the burying layer (see, e.g., Japanese Laid-Open Patent Publication No. 8-255950 (1996)).

SUMMARY OF THE INVENTION

Recently, there has been a great need for a semiconductor laser for use in high speed modulation applications (10 Gbps or more). However, conventional lasers whose burying layer includes a pn junction cannot be adapted to operate at high modulation rates of 10 Gbps or more, since the pn junction has high capacitance.

Further, in the manufacture of the semiconductor lasers disclosed in the above patent publication, the semi-insulating Fe-doped Al(Ga)InAs layer of the burying layer is exposed to the ambient atmosphere after the formation of the burying layer, resulting in oxidation of the Fe-doped Al(Ga)InAs layer. This oxidation prevents proper growth of a semiconductor layer on the semi-insulating Fe-doped Al(Ga)InAs layer, thereby causing defects and surface irregularities. The result is the degradation of the characteristics and yield of the semiconductor lasers.

The present invention has been devised to solve the above problems. It is, therefore, a first object of the present invention to provide a semiconductor laser capable of operating at a high modulation rate of 10 Gbps or more and also provide a method for manufacturing such a semiconductor laser.

A second object of the present invention is to provide a high yield manufacturing method for a semiconductor laser having only a low leakage current and capable of accommodating high speed modulation.

According to one aspect of the present invention, a semiconductor laser comprises: a ridge structure including a p-type cladding layer, an active layer, and an n-type cladding layer formed on top of one another; and a burying layer burying both sides of said ridge structure; wherein said burying layer includes a p-type semiconductor layer and an n-type semiconductor layer that form a pn junction; and wherein said p-type semiconductor layer or n-type semiconductor layer has a carrier concentration of $5\times10^{17}$ cm$^{-3}$ or less near said pn junction.

Thus, the first aspect of the present invention provides a semiconductor laser capable of operating at a high modulation rate of 10 Gbps or more; the second aspect of the invention provides a method for manufacturing a semiconductor laser capable of operating at a high modulation rate of 10 Gbps or more; and the third aspect of the invention provides a high yield manufacturing method for a semiconductor laser having only a low leakage current and capable of accommodating high speed modulation.

Other and further objects, features and advantages of the invention will appear more fully from the following description.

DETAILED DESCRIPTION OF THE PREFERRED EMBODIMENTS

First Embodiment

Figure 1:
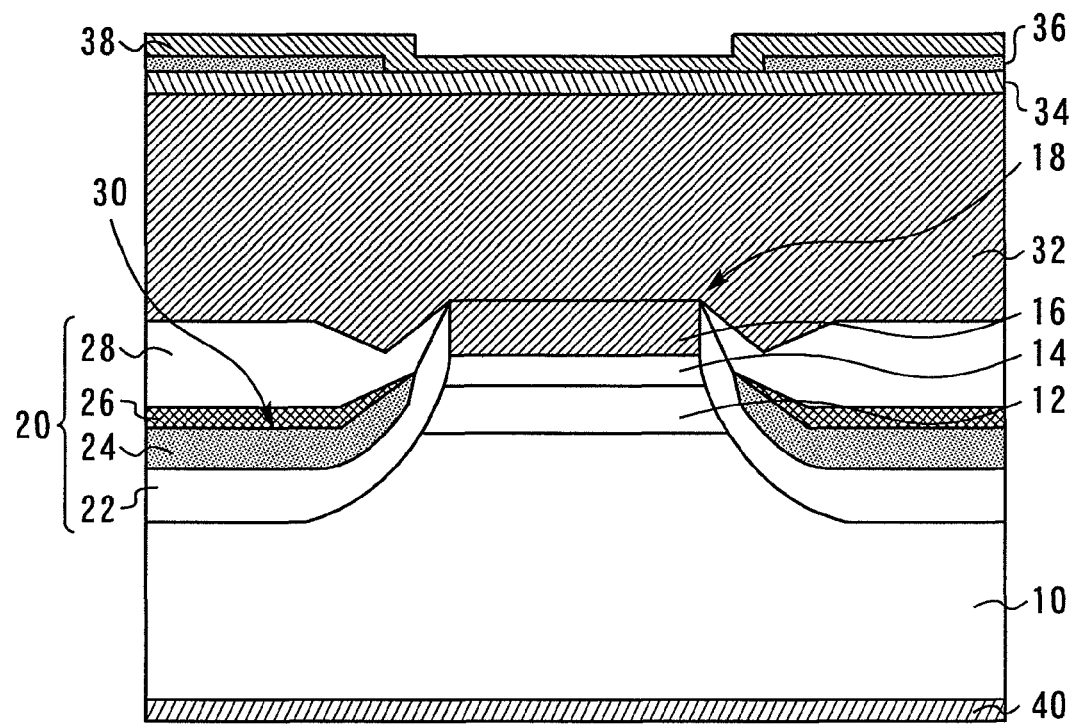
FIG. 1 is a cross-sectional view of a semiconductor laser according to a first embodiment of the present invention.

FIG. 1 is a cross-sectional view of a semiconductor laser according to a first embodiment of the present invention. Referring to FIG. 1, a ridge structure 18 is formed on a p-type InP substrate 10 (a semiconductor substrate). The ridge structure 18 includes a p-type InP cladding layer 12 (a p-type cladding layer), an AlGaInAs strained quantum well active layer 14 (an active layer), and an n-type InP cladding layer 16 (an n-type cladding layer) formed on top of one another in that order. It should be noted that the p-type InP cladding layer 12 and the n-type InP cladding layer 16 have a carrier concentration of $1\times10^{18}$ cm$^{-3}$.

Both sides of the ridge structure 18 are buried by a burying layer 20. The burying layer 20 includes a p-type InP layer 22, an n-type InP layer 24, a low carrier concentration p-type InP layer 26, and a p-type InP layer 28 formed on top of one another in that order. The low carrier concentration p-type InP layer 26 (a p-type semiconductor layer) and the n-type InP layer 24 (an n-type semiconductor layer) form a pn junction 30. The carrier concentrations of the layers in the burying layer 20 are as follows: the p-type InP layer 22, $1\times10^{18}$ cm$^{-3}$; the n-type InP layer 24, $1\times10^{19}$ cm$^{-3}$; the low carrier concentration p-type InP layer 26, $1\times10^{17}$ cm$^{-3}$; and the p-type InP layer 28, $1\times10^{18}$ cm$^{-3}$.

An n-type InP layer 32, an n-type InP contact layer 34, an SiO$_2$ insulating film 36, and an n-type electrode 38 of Ti/Pt/Au are sequentially formed on the ridge structure 18 and the burying layer 20. A p-type electrode 40 of Ti/Pt/Au is formed on the bottom surface of the p-type InP substrate 10. The n-type InP layer 32 has a carrier concentration of $1\times10^{18}$ cm$^{-3}$ and the n-type InP contact layer 34 has a carrier concentration of $1\times10^{19}$ cm$^{-3}$.

Figure 2:
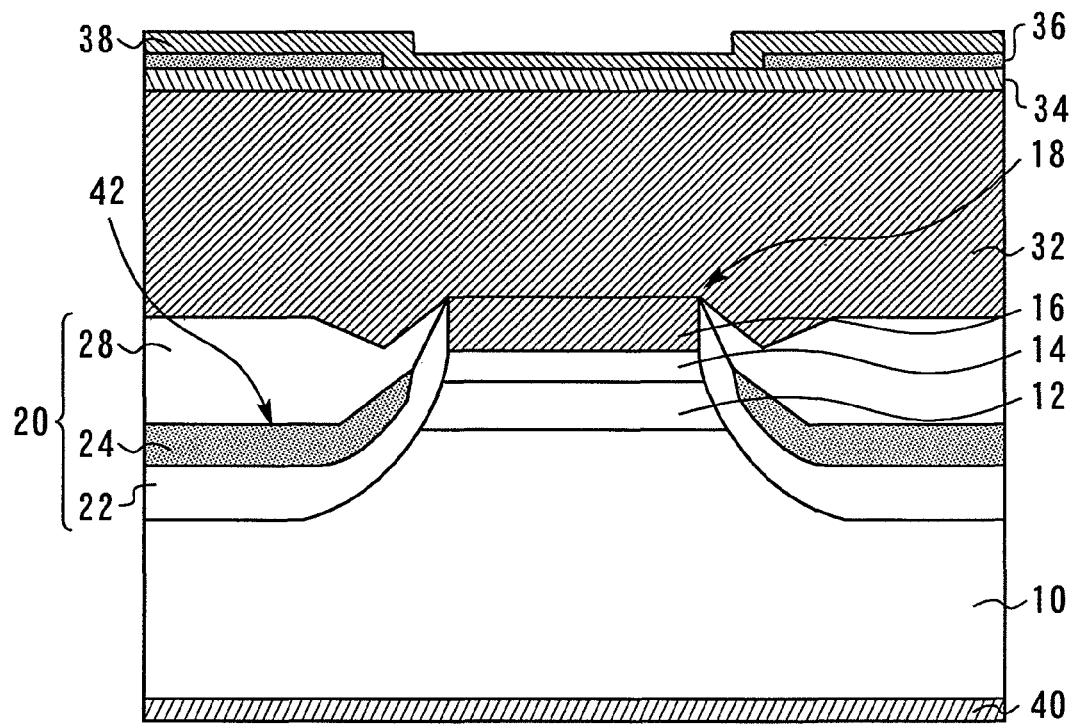
FIG. 2 is a cross-sectional view of the conventional semiconductor laser.

The advantages of the semiconductor laser of the present embodiment will be described by comparing it with a typical conventional semiconductor laser. FIG. 2 is a cross-sectional view of the conventional semiconductor laser. This semiconductor laser does not include the low carrier concentration p-type InP layer 26, as does the semiconductor laser of the present embodiment; therefore, the p-type InP layer 28 and the n-type InP layer 24 form a pn junction 42, as shown in FIG. 2. This pn junction 42 has a p-type carrier concentration of $1\times10^{18}$ cm$^{-3}$ and an n-type carrier concentration of $1\times10^{19}$ cm$^{-3}$. All other components are the same as in the semiconductor laser of the present embodiment.

In operation of each semiconductor laser, a reverse bias is applied to the pn junction of the burying layer 20. The capacitance, C, of the pn junction is calculated by the following equation:

$$C = S \times \sqrt{\frac{\varepsilon r \times \varepsilon o \times e}{2 \times \left(\frac{1}{Nd} + \frac{1}{Na}\right) \times Vbuilt}} \quad \text{[Equation 1]}$$

where: S is the area of the pn junction; er, the relative permittivity; eo, vacuum permittivity; Nd, the n-type carrier concentration; Na, the p-type carrier concentration; and Vbuilt, the built-in potential.

In the case of the conventional semiconductor laser, the capacitance C of the pn junction 42 is 2.8 pF and the cutoff frequency is 9 GHz, which is not high enough to provide a high modulation rate of 10 Gbps or more. On the other hand, in the semiconductor laser of the present embodiment, the low carrier concentration p-type InP layer 26 is disposed between the p-type InP layer 28 and the n-type InP layer 24. As a result, the low carrier concentration p-type InP layer 26 and the n-type InP layer 24 form the pn junction 30 having a p-type carrier concentration of $1\times10^{17}$ cm$^{-3}$, which is significantly lower than the p-type carrier concentration ($1\times10^{18}$ cm$^{-3}$) of the pn junction 42 of the conventional semiconductor laser. Therefore, the pn junction 30 has a capacitance C of 0.9 pF (which is significantly lower than the capacitance of the pn junction 42 of the conventional semiconductor laser), and the cutoff frequency, fc, is as high as 22 GHz, thus allowing the semiconductor laser to operate at a high modulation rate of 10 Gbps or more.

It should be noted that the lower the carrier concentration of the low carrier concentration p-type InP layer 26, the lower the capacitance of the pn junction 30 and hence the higher the modulation rate at which the semiconductor laser can operate. However, the maximum modulation rate of the semiconductor laser can be sufficiently increased by reducing the carrier concentration in the vicinity of the pn junction to $5\times10^{17}$ cm$^{-3}$ or less.

Second Embodiment

Figure 3:
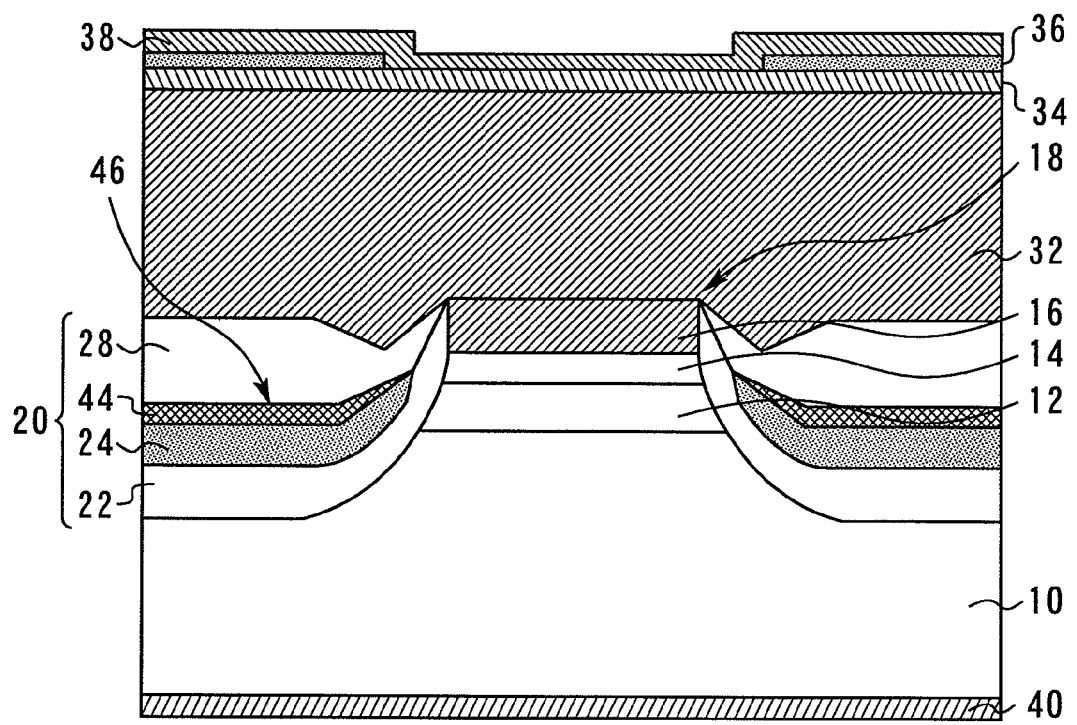
FIG. 3 is a cross-sectional view of a semiconductor laser according to a second embodiment of the present invention.

FIG. 3 is a cross-sectional view of a semiconductor laser according to a second embodiment of the present invention. This semiconductor laser differs from that of the first embodiment in that the low carrier concentration p-type InP layer 26 is replaced by a low carrier concentration n-type InP layer 44. The low carrier concentration n-type InP layer 44 has a carrier concentration of $1\times10^{17}$ cm$^{-3}$, and the p-type InP layer 28 (a p-type semiconductor layer) and the low carrier concentration n-type InP layer 44 (an n-type semiconductor layer) form a pn junction 46. All other components are the same as in the semiconductor laser of the first embodiment.

Thus in the semiconductor laser of the present embodiment, the low carrier concentration n-type InP layer 44 is disposed between the p-type InP layer 28 and the n-type InP layer 24, forming the pn junction 46. The pn junction 46 has an n-type carrier concentration of $1\times10^{17}$ cm$^{-3}$, which is significantly lower than the n-type carrier concentration ($1\times10^{19}$ cm$^{-3}$) of the pn junction 42 of the typical conventional semiconductor laser described above. As a result, the capacitance, C, of the pn junction 46 is 0.9 pF (which is significantly lower than the capacitance of the pn junction 42 of the conventional semiconductor laser), and the cutoff frequency, fc, is as high as 22 GHz, thus allowing the semiconductor laser to operate at a high modulation rate of 10 Gbps or more.

Third Embodiment

Figure 4:
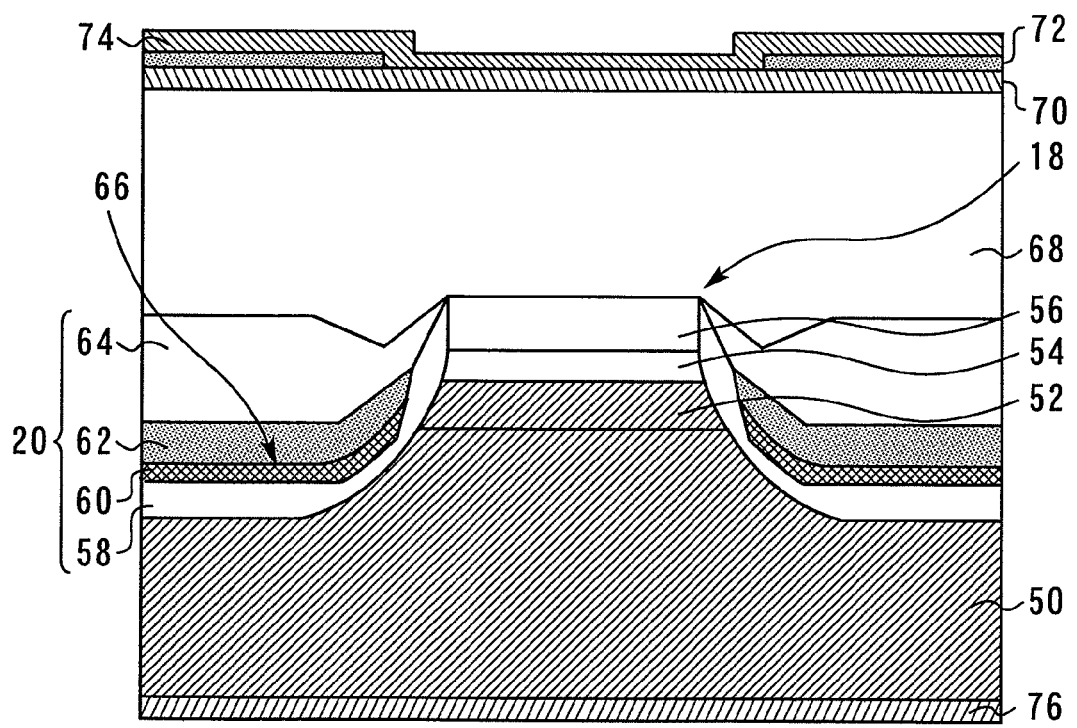
FIG. 4 is a cross-sectional view of a semiconductor laser according to a third embodiment of the present invention.

FIG. 4 is a cross-sectional view of a semiconductor laser according to a third embodiment of the present invention. This semiconductor laser differs from that of the first embodiment in that its semiconductor substrate is of a different conductivity type.

Specifically, referring to FIG. 4, a ridge structure 18 is formed on an n-type InP substrate 50 (a semiconductor substrate). The ridge structure 18 includes an n-type InP cladding layer 52 (an n-type cladding layer), an AlGaInAs strained quantum well active layer 54 (an active layer), and a p-type InP cladding layer 56 (a p-type cladding layer) formed on top of one another in that order. It should be noted that the n-type InP cladding layer 52 and the p-type InP cladding layer 56 have a carrier concentration of $1\times10^{18}$ cm$^{-3}$.

Both sides of the ridge structure 18 are buried by a burying layer 20. The burying layer 20 includes a p-type InP layer 58, a low carrier concentration p-type InP layer 60, an n-type InP layer 62, and a p-type InP layer 64 formed on top of one another in that order. The low carrier concentration p-type InP layer 60 (a p-type semiconductor layer) and the n-type InP layer 62 (an n-type semiconductor layer) form a pn junction 66. The carrier concentrations of the layers in the burying layer 20 are as follows: the p-type InP layer 58, $1\times10^{18}$ cm$^{-3}$; the low carrier concentration p-type InP layer 60, $1\times10^{17}$ cm$^{-3}$; the n-type InP layer 62, $1\times10^{19}$ cm$^{-3}$; and the p-type InP layer 64, $1\times10^{18}$ cm$^{-3}$.

A p-type InP layer 68, a p-type InGaAs contact layer 70, an SiO$_2$ insulating film 72, and a p-type electrode 74 of Ti/Pt/Au are sequentially formed on the ridge structure 18 and the burying layer 20. An n-type electrode 76 of Ti/Pt/Au is formed on the bottom surface of the n-type InP substrate 50. The p-type InP layer 68 has a carrier concentration of $1\times10^{18}$ cm$^{-3}$ and the p-type InGaAs contact layer 70 has a carrier concentration of $1\times10^{19}$ cm$^{-3}$.

Thus in the semiconductor laser of the present embodiment, the low carrier concentration p-type InP layer 60 is disposed between the n-type InP layer 62 and the p-type InP layer 58, forming the pn junction 66. The pn junction 66 has a p-type carrier concentration of $1\times10^{17}$ cm$^{-3}$, which is significantly lower than the p-type carrier concentration ($1\times10^{18}$ cm$^{-3}$) of the pn junction 42 of the typical conventional semiconductor laser described above. As a result, the capacitance, C, of the pn junction 66 is 0.9 pF (which is significantly lower than the capacitance of the pn junction 42 of the conventional semiconductor laser), and the cutoff frequency, fc, is as high as 22 GHz, thus allowing the semiconductor laser to operate at a high modulation rate of 10 Gbps or more.

Fourth Embodiment

Figure 5:
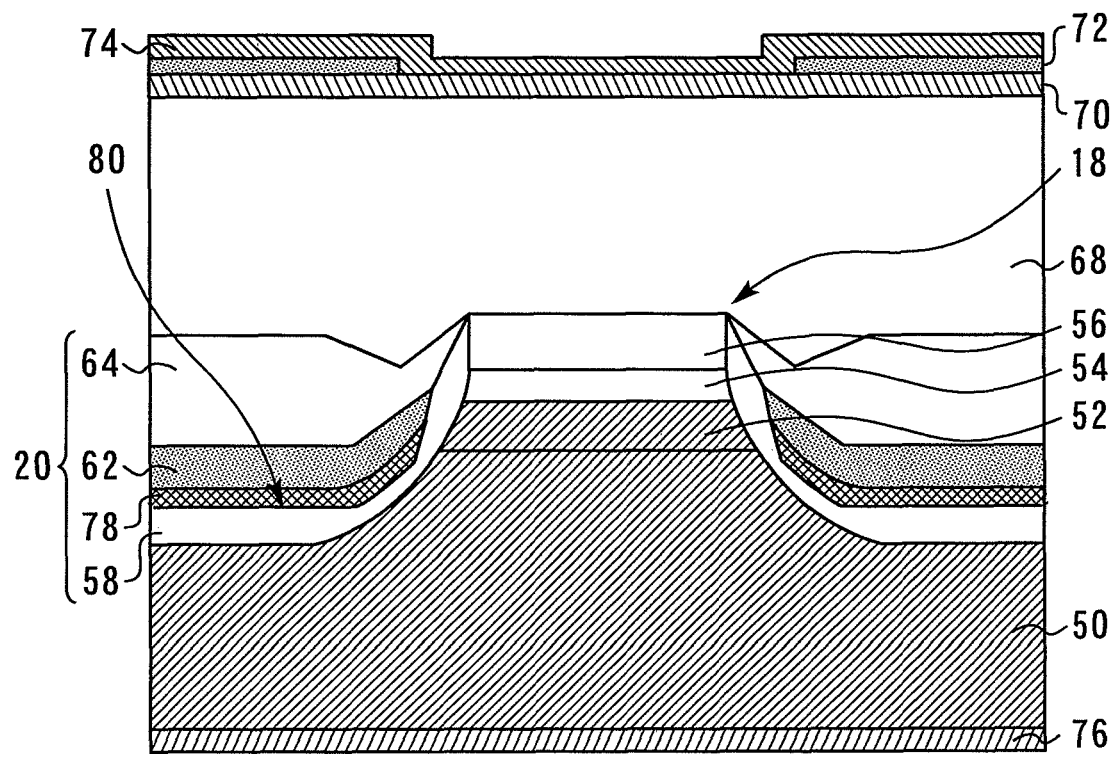
FIG. 5 is a cross-sectional view of a semiconductor laser according to a fourth embodiment of the present invention.

FIG. 5 is a cross-sectional view of a semiconductor laser according to a fourth embodiment of the present invention. This semiconductor laser differs from that of the third embodiment in that the low carrier concentration p-type InP layer 60 is replaced by a low carrier concentration n-type InP layer 78. The low carrier concentration n-type InP layer 78 has a carrier concentration of $1 \times 10^{17}$ cm$^{-3}$, and the p-type InP layer 58 (a p-type semiconductor layer) and the low carrier concentration n-type InP layer 78 (an n-type semiconductor layer) form a pn junction 80. All other components are the same as in the semiconductor laser of the third embodiment.

Thus in the semiconductor laser of the present embodiment, the low carrier concentration n-type InP layer 78 is disposed between the n-type InP layer 62 and the p-type InP layer 58, forming the pn junction 80. The pn junction 80 has an n-type carrier concentration of $1 \times 10^{17}$ cm$^{-3}$, which is significantly lower than the n-type carrier concentration ($1 \times 10^{19}$ cm$^{-3}$) of the pn junction 42 of the typical conventional semiconductor laser described above. As a result, the capacitance, C, of the pn junction 80 is 0.9 pF (which is significantly lower than the capacitance of the pn junction 42 of the conventional semiconductor laser), and the cutoff frequency, fc, is as high as 22 GHz, thus allowing the semiconductor laser to operate at a high modulation rate of 10 Gbps or more.

Fifth Embodiment

There will be described, with reference to FIGS. 6 to 10, a method for manufacturing a semiconductor laser according to a fifth embodiment of the present invention.

Figure 6:
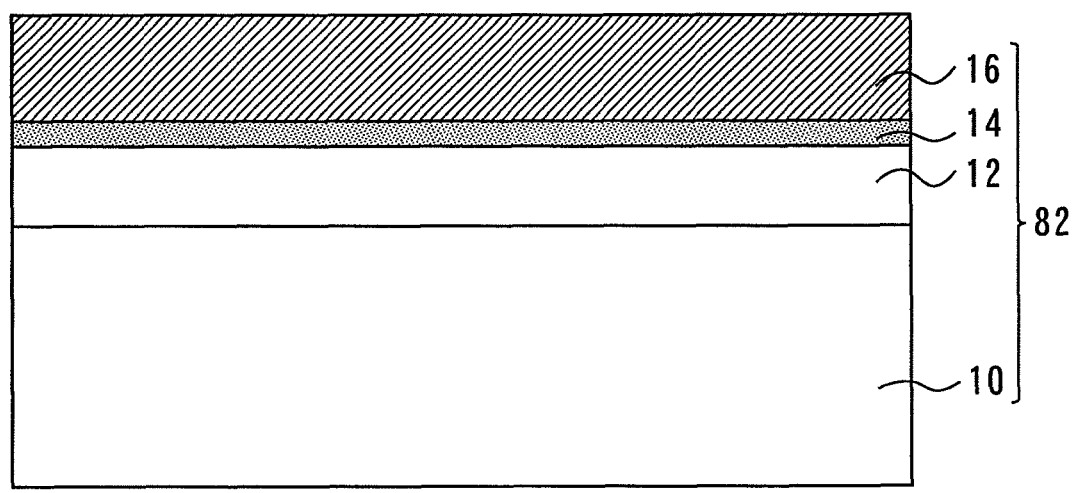
FIGS. 6-10 are sectional views for explaining a method of manufacturing a semiconductor device according to a fifth embodiment of the present invention.

This method begins by forming a layer stack 82 on a p-type InP substrate 10 (a semiconductor substrate) by MOCVD. The layer stack 82 includes a p-type InP cladding layer 12 (a p-type cladding layer), an AlGaInAs strained quantum well active layer 14 (an active layer), and an n-type InP cladding layer 16 (an n-type cladding layer) formed on top of one another, as shown in FIG. 6.

Figure 7:
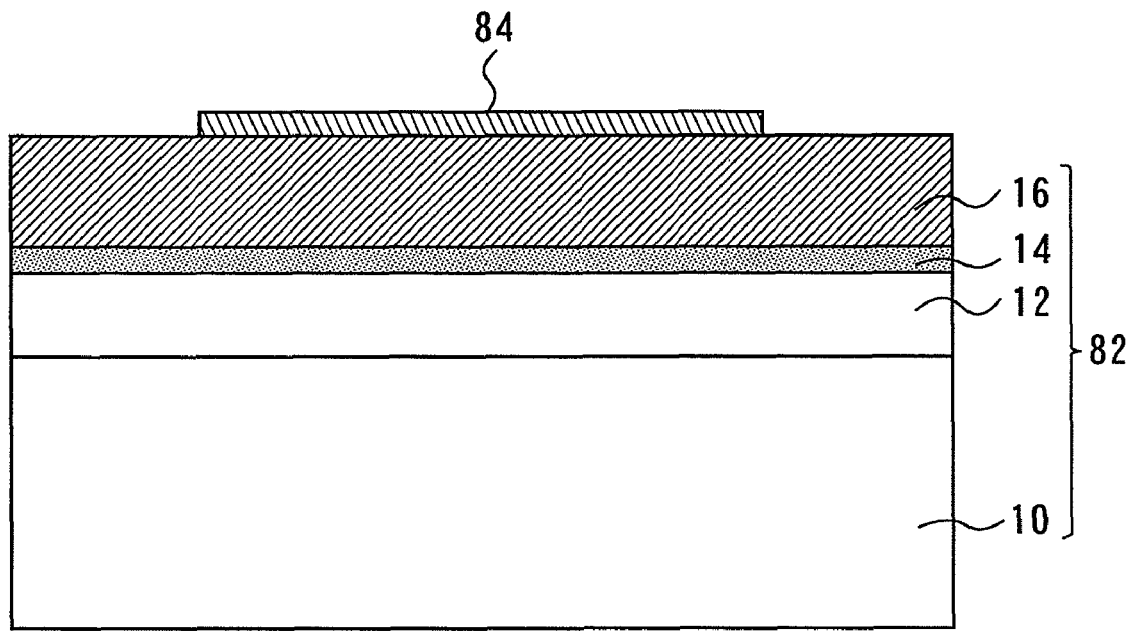
Figure 8:
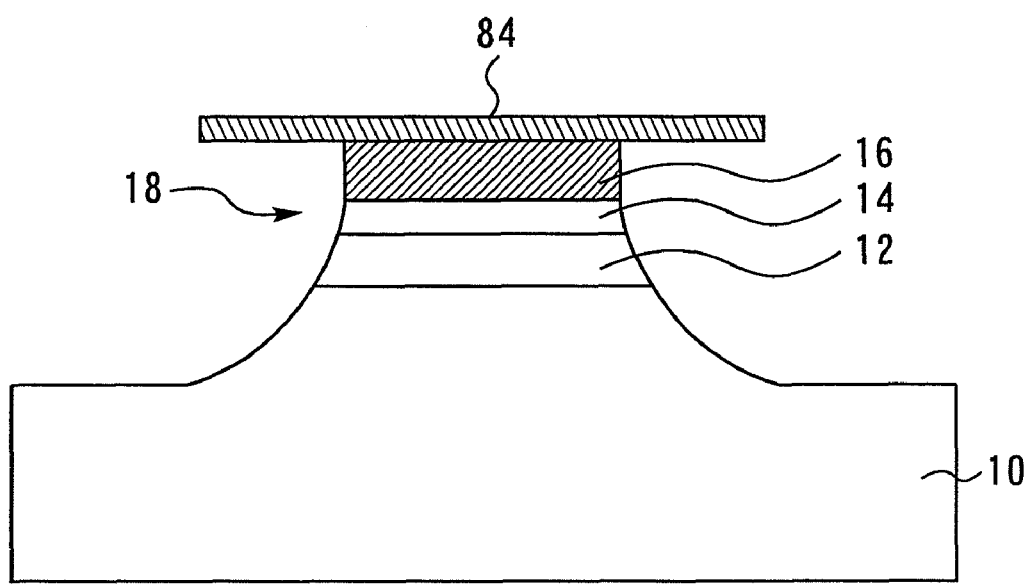

Next, an SiO$_2$ insulating film 84 is formed on the n-type InP cladding layer 16 and patterned as shown in FIG. 7. The layer stack 82 is then etched by wet etching, etc. using the SiO$_2$ insulating film 84 as a mask to form a ridge structure 18, as shown in FIG. 8.

Figure 9:
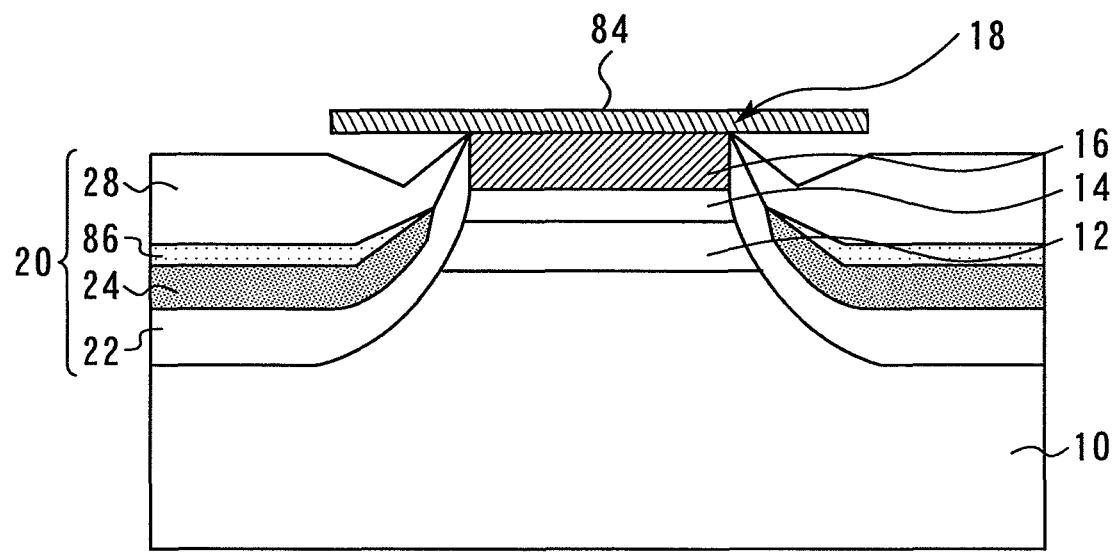

A burying layer 20 is then formed to bury, or cover, both sides of the ridge structure 18, as shown in FIG. 9. Specifically, the burying layer 20 includes a p-type InP layer 22, an n-type InP layer 24 (an n-type semiconductor layer), an undoped InP layer 86 (an undoped semiconductor layer), and a p-type InP layer 28 (a p-type semiconductor layer) formed on top of one another in that order by MOCVD.

Figure 10:
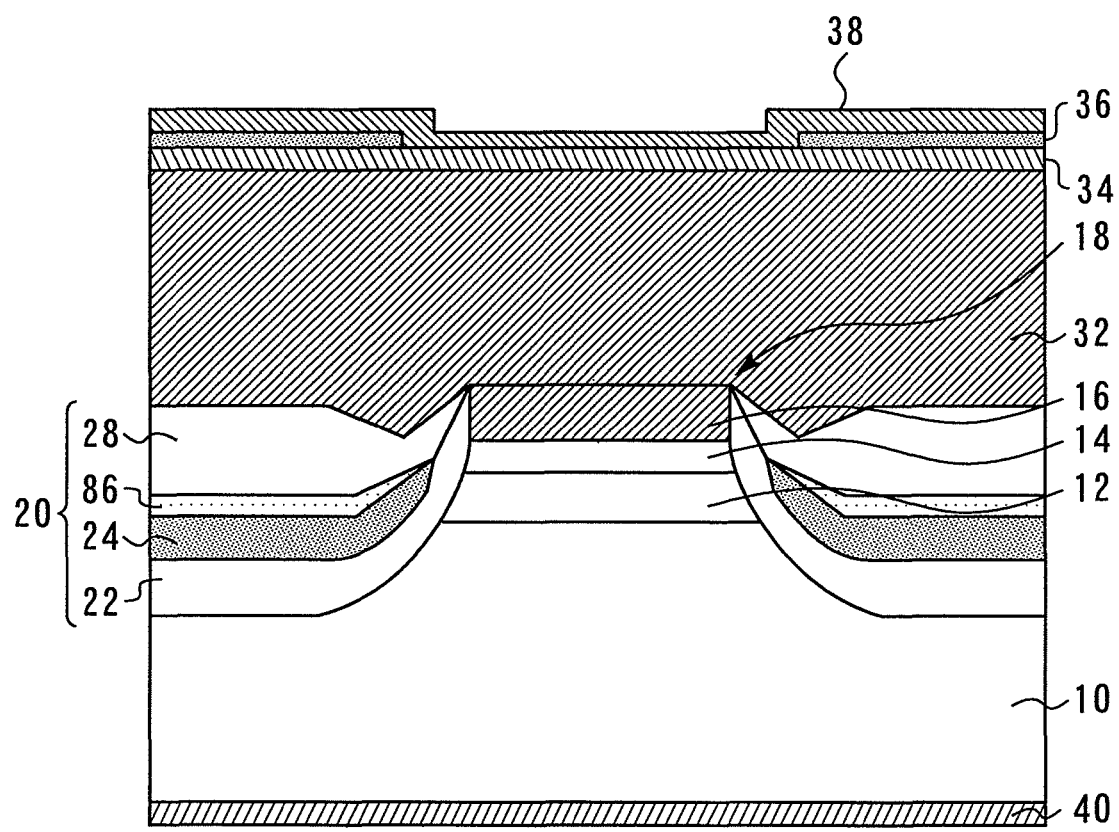

Next, the SiO$_2$ insulating film 84 is etched away, and an n-type InP layer 32 and an n-type InP contact layer 34 are successively formed on the ridge structure 18 and the burying layer 20 by MOCVD. An SiO$_2$ insulating film 36 and an n-type electrode 38 of Ti/Pt/Au are then formed on the n-type InP contact layer 34. Further, a p-type electrode 40 of Ti/Pt/Au is formed on the bottom surface of the p-type InP substrate 10. FIG. 10 shows the resultant structure.

A p-type dopant (e.g., Zn) is then diffused into the undoped InP layer 86 from the p-type InP layer 28 to transform the undoped InP layer 86 into a p-type semiconductor layer having a carrier concentration of $5 \times 10^{17}$ cm$^{-3}$ or less. As a result, this semiconductor laser has the same structure as the semiconductor laser of the first embodiment and hence has the same advantages as described in connection with the first embodiment.

It is to be appreciated that the undoped InP layer 86 may be replaced by an undoped InGaAsP layer or undoped AlInAs layer. A p-type dopant has a lower diffusion coefficient in an InGaAsP layer than in an InP layer, meaning that the carrier concentration of the InGaAsP layer can be reduced as compared to the InP layer. Further, the diffusion coefficient of the p-type dopant is even lower in an AlInAs layer than in an InGaAsP layer. Therefore, the carrier concentration of the AlInAs layer can be reduced even as compared to the InGaAsP layer.

Sixth Embodiment

Figure 11:
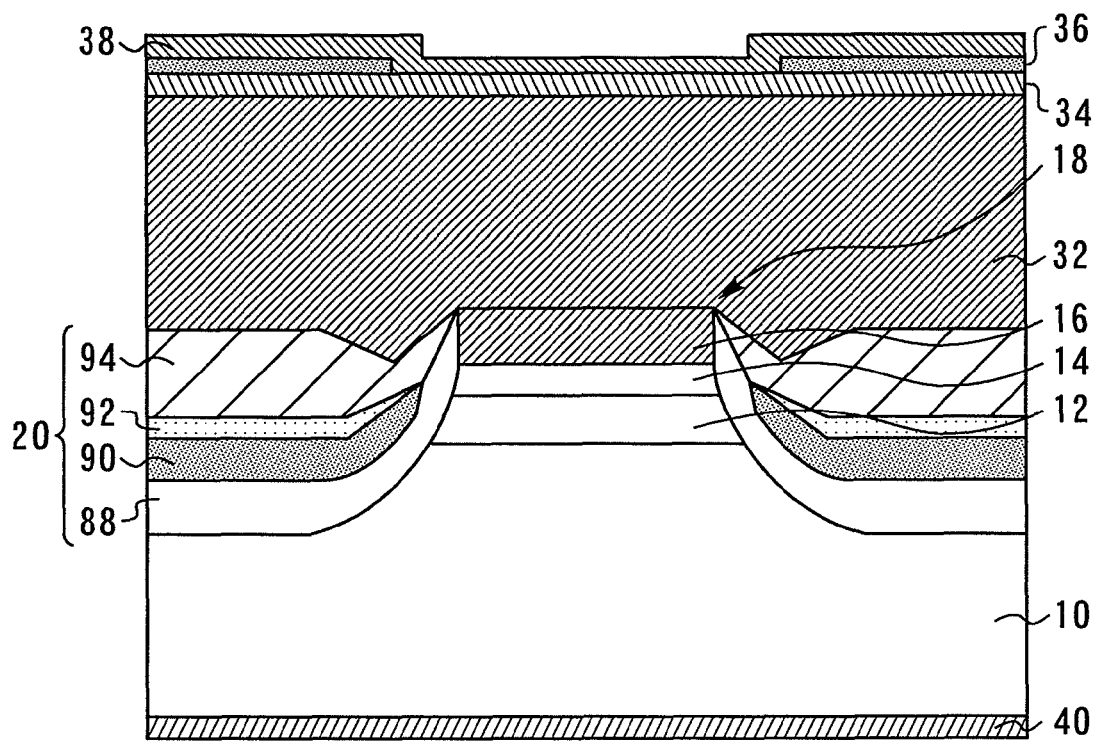
FIG. 11 is a cross-sectional view of a semiconductor laser according to a sixth embodiment of the present invention.

FIG. 11 is a cross-sectional view of a semiconductor laser according to a sixth embodiment of the present invention. It should be noted that components common to the semiconductor laser of the first embodiment will retain the same reference numerals, and a description of these components will not be provided herein.

Both sides of the ridge structure, 18, are buried by a burying layer 20. The burying layer 20 includes a p-type InP layer 88, an n-type InP layer 90, a semi-insulating Fe-doped Al(Ga)InAs layer 92, and a semi-insulating Fe-doped InP layer 94 formed on top of one another in that order. The carrier concentrations of the layers in the burying layer 20 are as follows: the p-type InP layer 88, $1 \times 10^{18}$ cm$^{-3}$; the n-type InP layer 90, $1 \times 10^{19}$ cm$^{-3}$; the semi-insulating Fe-doped Al(Ga)InAs layer 92, $8 \times 10^{16}$ cm$^{-3}$; and the semi-insulating Fe-doped InP layer 94, $8 \times 10^{16}$ cm$^{-3}$.

In the semiconductor laser of the present embodiment, since the burying layer 20 includes the semi-insulating Fe-doped InP layer 94, the capacitance of the burying layer 20 can be reduced to a very small value, namely 0.1 pF, thereby allowing the semiconductor laser to accommodate higher speed modulation (as compared to the embodiments described above). Further, the burying layer 20 also includes the semi-insulating Fe-doped Al(Ga)InAs layer 92 having a wider bandgap than InP to reduce electron overflow and thereby reduce the amount of leakage current flowing vertically through the burying layer 20.

There will be described, with reference to FIGS. 6 to 8 and 12 to 16, a method for manufacturing a semiconductor laser according to the sixth embodiment. As in the fifth embodiment, first a ridge structure 18 is formed using the steps shown in FIGS. 6 to 8.

Figure 12:
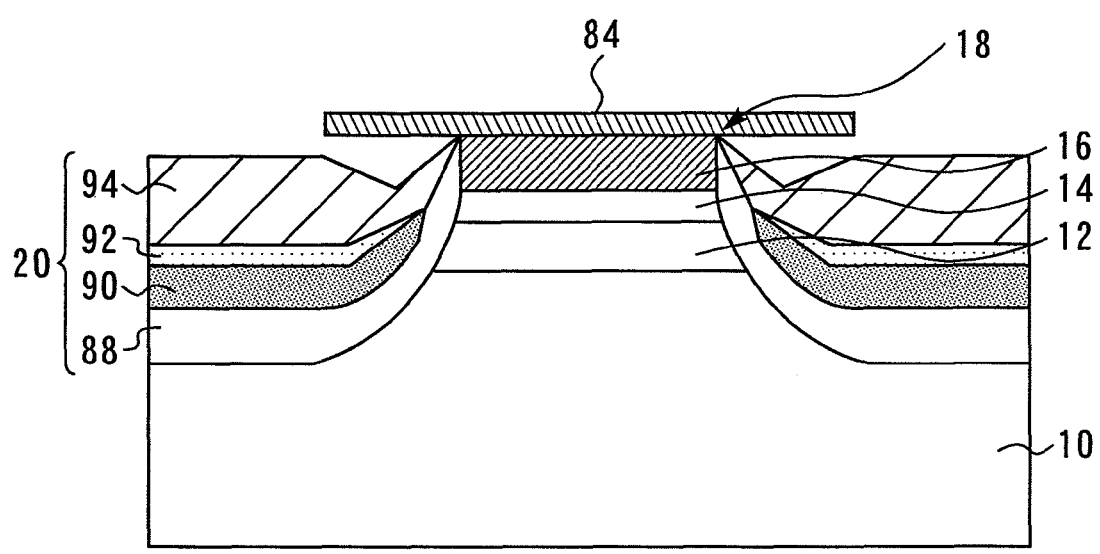
FIGS. 12-16 are sectional views for explaining a method of manufacturing a semiconductor device according to a sixth embodiment of the present invention.

Next, a burying layer 20 is formed to bury, or cover, both sides of the ridge structure 18, as shown in FIG. 12. Specifically, the burying layer 20 includes a p-type InP layer 88, an n-type InP layer 90, a semi-insulating Fe-doped Al(Ga)InAs layer 92, and a semi-insulating Fe-doped InP layer 94 formed on top of one another in that order by MOCVD.

Figure 13:
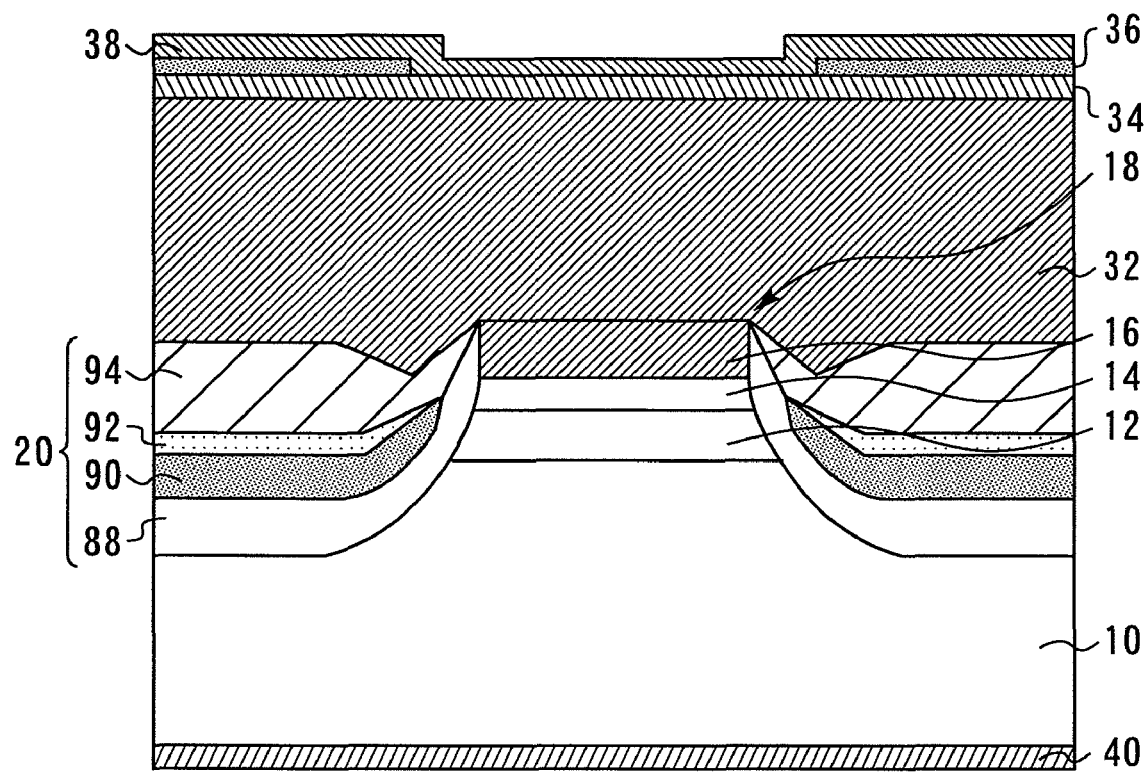

The SiO$_2$ insulating film 84 (used in the previous step) is then etched away, and an n-type InP layer 32 and an n-type InP contact layer 34 are successively formed on the ridge structure 18 and the burying layer 20 by MOCVD. An SiO$_2$ insulating film 36 and an n-type electrode 38 of Ti/Pt/Au are then formed on the n-type InP contact layer 34. Further, a p-type electrode 40 of Ti/Pt/Au is formed on the bottom surface of the p-type InP substrate 10. This completes the manufacture of the semiconductor laser of the present embodiment, as shown in FIG. 13.

This embodiment is characterized in that the semi-insulating Fe-doped Al(Ga)InAs layer 92 is completely covered by the overlying semi-insulating Fe-doped InP layer 94 and hence is not exposed to the ambient atmosphere after the formation of the Fe-doped InP layer 94, as shown in FIG. 11. The following describes in detail the manner in which the burying layer 20 (which includes these semi-insulating layers) is grown.

Figure 14:
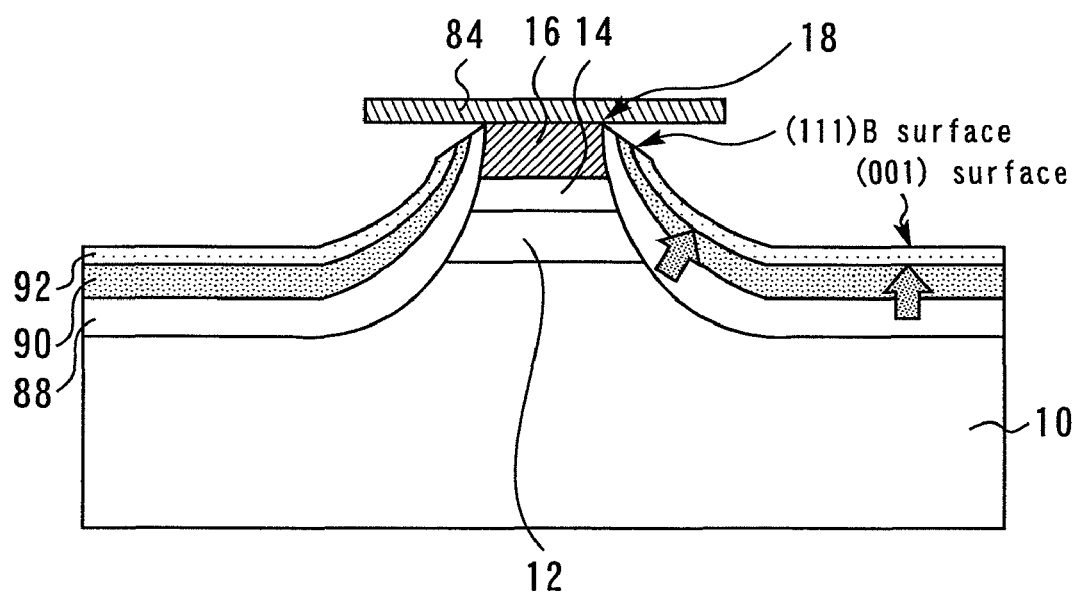

Referring to FIG. 14, first, the p-type InP layer 88, the n-type InP layer 90, and the semi-insulating Fe-doped Al(Ga)InAs layer 92 are crystallographically grown on top of one another on the (001) surface of the substrate 10 (i.e., grown upward) and on both sides of the ridge structure 18 (i.e., grown sideways from these sides). However, these layers are not grown on the (111)B surface (see FIG. 14).

Figure 15:
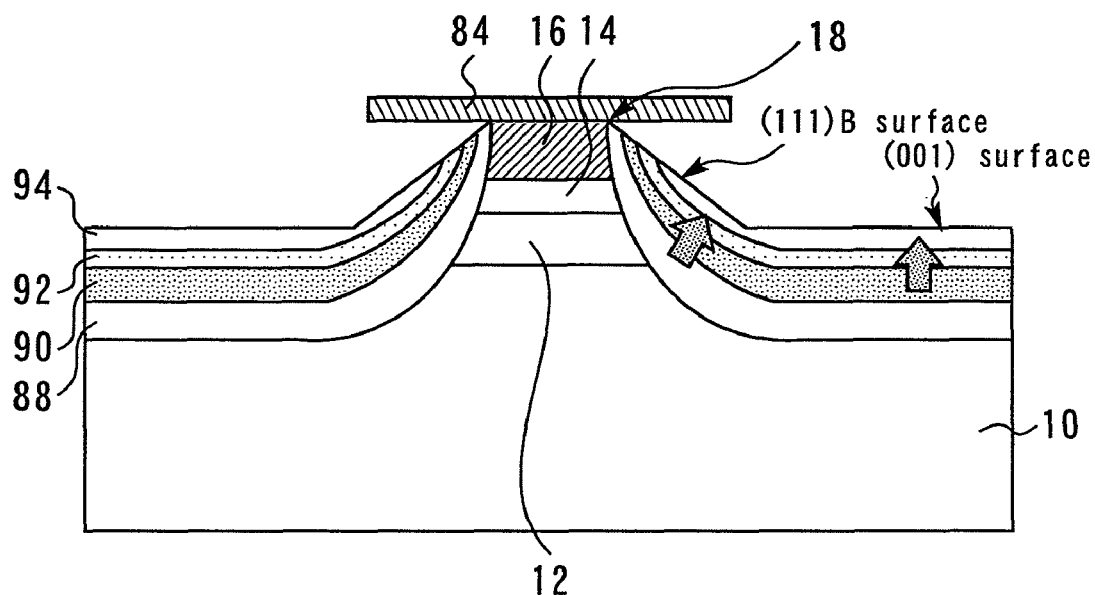

Next, the semi-insulating Fe-doped InP layer 94 is formed on the semi-insulating Fe-doped Al(Ga)InAs layer 92. Specifically, as the crystal growth of the semi-insulating Fe-doped InP layer 94 progresses, the (001) surface (a growing surface) of the Fe-doped InP layer 94 meets the (111)B surface, as shown in FIG. 15. After this, the semi-insulating Fe-doped InP layer 94 has only two growing surfaces: (001) and (111)B surfaces.

Figure 16:
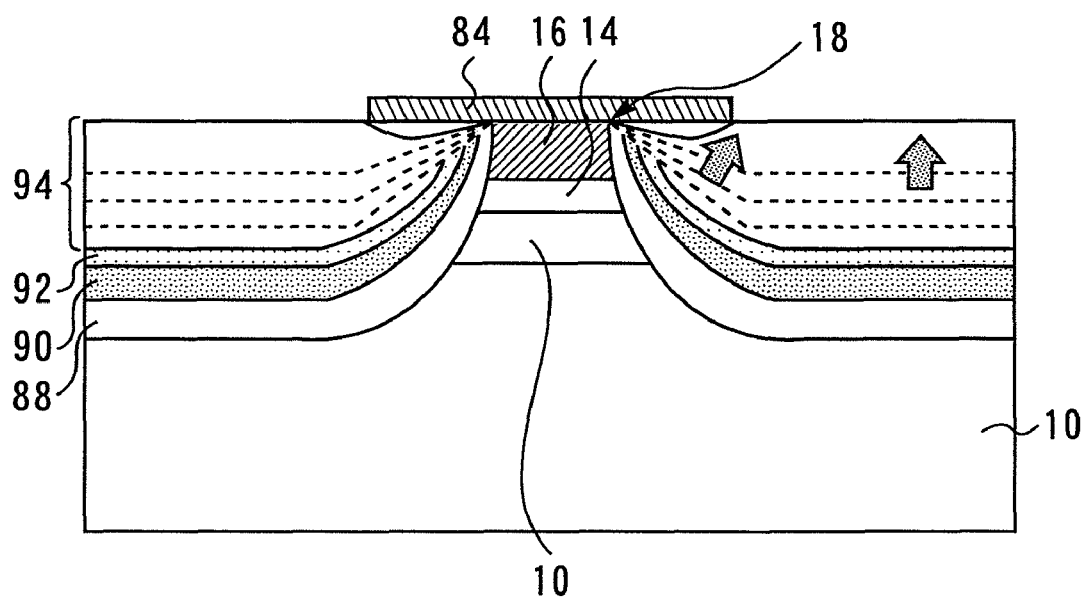

Then the crystal growth of the semi-insulating Fe-doped InP layer 94 is further promoted on the (001) and (111)B surfaces, resulting in the formation of the structure shown in FIG. 16 with the semi-insulating InP layer 94 touching the p-type InP layer 88, as shown in FIG. 16 and more clearly in FIGS. 11 and 13.

Thus, the crystal growth of the semi-insulating Fe-doped Al(Ga)InAs layer 92 is stopped before its (001) surface (a growing surface) meets the (111)B surface shown in FIG. 14. This allows the overlying semi-insulating Fe-doped InP layer 94 to be so formed as to completely cover the semi-insulating Fe-doped Al(Ga)InAs layer 92 from exposure to the atmosphere.

According to the present embodiment described above, the semi-insulating Fe-doped Al(Ga)InAs layer 92 is completely covered by the overlying semi-insulating Fe-doped InP layer 94 and hence is not exposed to the ambient atmosphere after the formation of the Fe-doped InP layer 94, thereby preventing oxidation of the Fe-doped Al(Ga)InAs layer 92. This ensures that the n-type InP layer 32 can be properly grown above the semi-insulating Fe-doped Al(Ga)InAs layer 92 without defects. Thus, the present embodiment provides a high yield manufacturing method for a semiconductor laser having only a low leakage current and capable of accommodating high speed modulation.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-136513, filed on May 26, 2008 including specification, claims, drawings and summary, on which the Convention priority of the present application is based, are incorporated herein by reference in its entirety.

What is claimed is:

1. A semiconductor laser comprising:
   a semiconductor substrate of a first conductivity type;
   a ridge structure supported by the semiconductor substrate, having opposed side surfaces, and including, in a stack, a first cladding layer of the first conductivity type, an active layer, and a second cladding layer of a second conductivity type, opposite the first conductivity type; and
   a burying layer structure in contact with the side surfaces of the ridge structure and including, in a stack,
      a p-type InP layer in contact with the semiconductor substrate and the side surfaces of the ridge structure,
      an n-type InP layer contacting the p-type InP layer,
      an Fe-doped semi-insulating Al(Ga)InAs layer in contact with n-type InP layer, and
      an Fe-doped semi-insulating InP layer in contact with and completely covering the Fe-doped semi-insulating Al(Ga)InAs layer and in contact with the p-type InP layer.

2. The semiconductor laser as claimed in claim 1, wherein the Fe-doped semi-insulating InP layer has only two planar grown surfaces which are (001) and (111)B surfaces, and
   each of the p-type InP layer, the n-type InP layer, and the Fe-doped semi-insulating Al(Ga)InAs layer has only a single planar grown surface, each grown surface being a (001) surface.

* * * * *